United States Patent
Kang

(10) Patent No.: US 6,178,135 B1
(45) Date of Patent: Jan. 23, 2001

(54) MULTI-BANK MEMORY DEVICES HAVING BANK SELECTION SWITCHES THEREIN THAT ENABLE EFFICIENT SENSE AMPLIFIER UTILIZATION

(75) Inventor: Kyung-woo Kang, Kyungki-do (KR)

(73) Assignee: Samsung Electronics Co., Ltd. (KR)

(*) Notice: Under 35 U.S.C. 154(b), the term of this patent shall be extended for 0 days.

(21) Appl. No.: 09/464,826

(22) Filed: Dec. 17, 1999

(30) Foreign Application Priority Data

Dec. 28, 1998 (KR) .................................................. 98-59498

(51) Int. Cl.[7] ........................................................ G11C 8/00
(52) U.S. Cl. ................................ 365/230.03; 365/230.04; 365/51; 365/63
(58) Field of Search .......................... 365/230.03, 230.04, 365/51, 63

(56) References Cited

U.S. PATENT DOCUMENTS

| | | | |
|---|---|---|---|
| 5,666,322 | * 9/1997 | Conkle | 365/230.03 X |
| 5,689,472 | * 11/1997 | Tanaka et al. | 365/230.04 |
| 5,701,268 | 12/1997 | Lee et al. | 365/205 |
| 5,953,259 | 9/1999 | Yoon et al. | 365/189.04 |
| 6,002,631 | * 12/1999 | Haga et al. | 365/230.03 |

* cited by examiner

Primary Examiner—Huan Hoang
(74) Attorney, Agent, or Firm—Myers Bigel Sibley & Sajovec

(57) ABSTRACT

Multi-bank memory devices include a plurality of memory banks and a plurality of data buses that are connected to the memory banks in a manner that enables the efficient use of a reduced number of shared sense amplifiers and driver circuits during reading and writing operations. The memory device has a plurality of memory banks therein with each memory bank comprising a plurality of memory blocks. A plurality of data buses are also provided and each of these data buses is preferably coupled to at least two of the memory banks so that shared reading and writing operations can be performed in an efficient manner using bank selection switches. In particular, first and second data buses are provided along with circuitry that provides read data from first and second memory blocks within a first memory bank to the first and second data buses, respectively, during a first read operation and provides read data from second and first memory blocks within a second memory bank to the first and second data buses, respectively, during a second read operation. The first and second data buses are used to transfer read data from the first memory bank and transfer read data from the second memory bank as well. Based on this configuration of the data buses, it may not be necessary a provide a relatively large data bus dedicated to solely the first memory bank and another relatively large data bus dedicated to solely the second memory bank. Instead, smaller shared data buses can be used.

19 Claims, 5 Drawing Sheets

MULTI-BANK MEMORY DEVICES HAVING BANK SELECTION SWITCHES THEREIN THAT ENABLE EFFICIENT SENSE AMPLIFIER UTILIZATION

RELATED APPLICATION

This application is related to Korean Application No. 98-59498, filed Dec. 28, 1998, the disclosure of which is hereby incorporated herein by reference.

FIELD OF THE INVENTION

The present invention relates to integrated circuit devices and methods of operating integrated circuit devices, and more particularly to integrated circuit memory devices and methods of operating integrated circuit memory devices.

BACKGROUND OF THE INVENTION

Dynamic random access memory (DRAM) devices typically utilize sense amplifiers to facilitate efficient reading and writing operations. Such sense amplifiers may be referred to as input/output sense amplifiers and may be constructed in a manner similar to the sense amplifiers described in commonly assigned U.S. Pat. Nos. 5,701,268 to Lee et al. and 5,953,259 to Yoon et al., the disclosures of which are hereby incorporated herein by reference.

In multi-bank memory devices, dedicated data buses are typically provided so that data being read from a respective memory bank or written to a respective memory bank can be sensed and amplified by a dedicated group of sense amplifiers. Thus, for example, a multi-bank memory device having four banks of memory may include four dedicated data buses and four dedicated groups of sense amplifiers where each group of sense amplifiers operates on data being passed to or received from a respective memory bank. Unfortunately, the use of dedicated data buses and dedicated sense amplifiers reduces layout efficiency, particularly as the storage capacity of the memory banks increase. Accordingly, notwithstanding conventional multi-bank memory devices, there continues to be a need for improved data bus and sense amplifier circuits that can used with large memory banks and have reduced layout area requirements.

SUMMARY OF THE INVENTION

It is therefore an object of the present invention to provide improved integrated circuit memory devices and methods of operating same.

It is another object of the present invention to provide integrated circuit memory devices that can efficiently handle multi-bank reading and writing operations and methods of operating same.

It is still another object of the present invention to provide integrated circuit memory devices having reduced layout area requirements and methods of operating same.

These and other objects, advantages and features of the present invention are provided by integrated circuit memory devices that include a plurality of memory banks and a plurality of data buses that are connected to the memory banks in a preferred manner to enable the efficient use of a reduced number of shared sense amplifiers and driver circuits during reading and writing operations. According to a preferred embodiment of the present invention, an integrated circuit memory device is provided having plurality of memory banks therein with each memory bank comprising a plurality of memory blocks. A plurality of data buses are also provided and each of these data buses is preferably coupled to at least two of the memory banks so that shared data reading and data writing operations can be performed in an efficient manner using bank selection switches.

In particular, preferred integrated circuit memory devices comprise first and second memory banks which each have respective pluralities of memory blocks therein. First and second data buses are also provided along with circuitry that provides read data from first and second memory blocks within the first memory bank to the first and second data buses, respectively, during a first read operation and provides read data from second and first memory blocks within the second memory bank to the first and second data buses, respectively, during a second read operation. Accordingly, the first and second data buses are used to transfer read data from the first memory bank and transfer read data from the second memory bank as well. In the event the first data bus comprises a first plurality of pairs of differential data lines, circuitry may also be provided that electrically couples the first plurality of pairs of differential data lines to the first memory blocks within the first memory bank during the first read operation, and electrically couples the first plurality of pairs of differential data lines to the second memory blocks within the second memory bank during the second read operation. This circuitry may also electrically couple a second plurality of pairs of differential data lines within the second data bus to the second memory blocks within the first memory bank during the first read operation, and electrically couple the second plurality of pairs of differential data lines to the first memory blocks within the second memory bank during the second read operation. Based on this aspect of the present invention, it may not be necessary a provide a relatively large data bus dedicated to solely the first memory bank and another relatively large data bus dedicated to solely the second memory bank. Instead, a relatively small data bus having half the width of the dedicated data bus can be coupled to first and second portions of the first and second memory banks, respectively, and another relatively small data bus can be coupled to second and first portions of the first and second memory banks, respectively.

According to another preferred aspect of the present invention, first and second bank selection switches are provided and these first and second bank selection switches are electrically coupled to the first and second data buses, respectively. In addition, a first plurality of sense amplifiers are provided that are electrically coupled to the first bank selection switch and a second plurality of sense amplifiers are provided that are electrically coupled to the second bank selection switch. Based on this aspect of the present invention, the selection switches can be controlled in a preferred manner so that the first and second pluralities of sense amplifiers are both used when data is being read from and written to the first memory bank, and are both used when data is being read from and written to the second memory bank. It is therefore unnecessary to provide a plurality of dedicated sense amplifiers for reading data from and writing data to only a first bank of memory and provide another dedicated plurality of sense amplifiers for reading data from and writing data to only a second bank of memory. Thus, according to the present invention, data buses having reduced size can be used in combination with bank selection switches and a reduced number of sense amplifiers to provide an integrated circuit memory device having reduced layout area requirements.

Another embodiment of the present invention includes preferred methods of operating multi-bank memory devices. These preferred methods include the steps of transferring first read data from first and second memory blocks within a first memory bank (BANK 1) to first and second data buses, respectively, and then transferring the first read data from the first and second data buses to first and second sense amplifiers, respectively. These data buses and sense amplifiers can also be used when transferring second read data from first and second memory blocks within a second memory bank (BANK 2) to the first and second data buses, respectively, and then transferring the second read data from the first and second data buses to the first and second sense amplifiers, respectively. The step of transferring the first read data from the first and second data buses to the first and second sense amplifiers may also comprise the steps of simultaneously transferring a first portion of the first read data from the first data bus through a first selection switch to the first sense amplifier and a second portion of the first read data from the second data bus through a second selection switch to the second sense amplifier. Moreover, these methods may also include the steps of transferring a first portion of first write data from the first sense amplifier to the first data bus while simultaneously transferring a second portion of the first write data from the second sense amplifier to the second data bus. These steps may be followed by the step of transferring the first and second portions of the first write data from the first and second data buses, respectively, to the first memory bank. These latter transferring steps may be performed with or without transferring the first portion of the first write data through the first or second bank selection switches. In particular, a master write signal may be used to control whether the bank selection switches.

DESCRIPTION OF PREFERRED EMBODIMENTS

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

Figure 1:
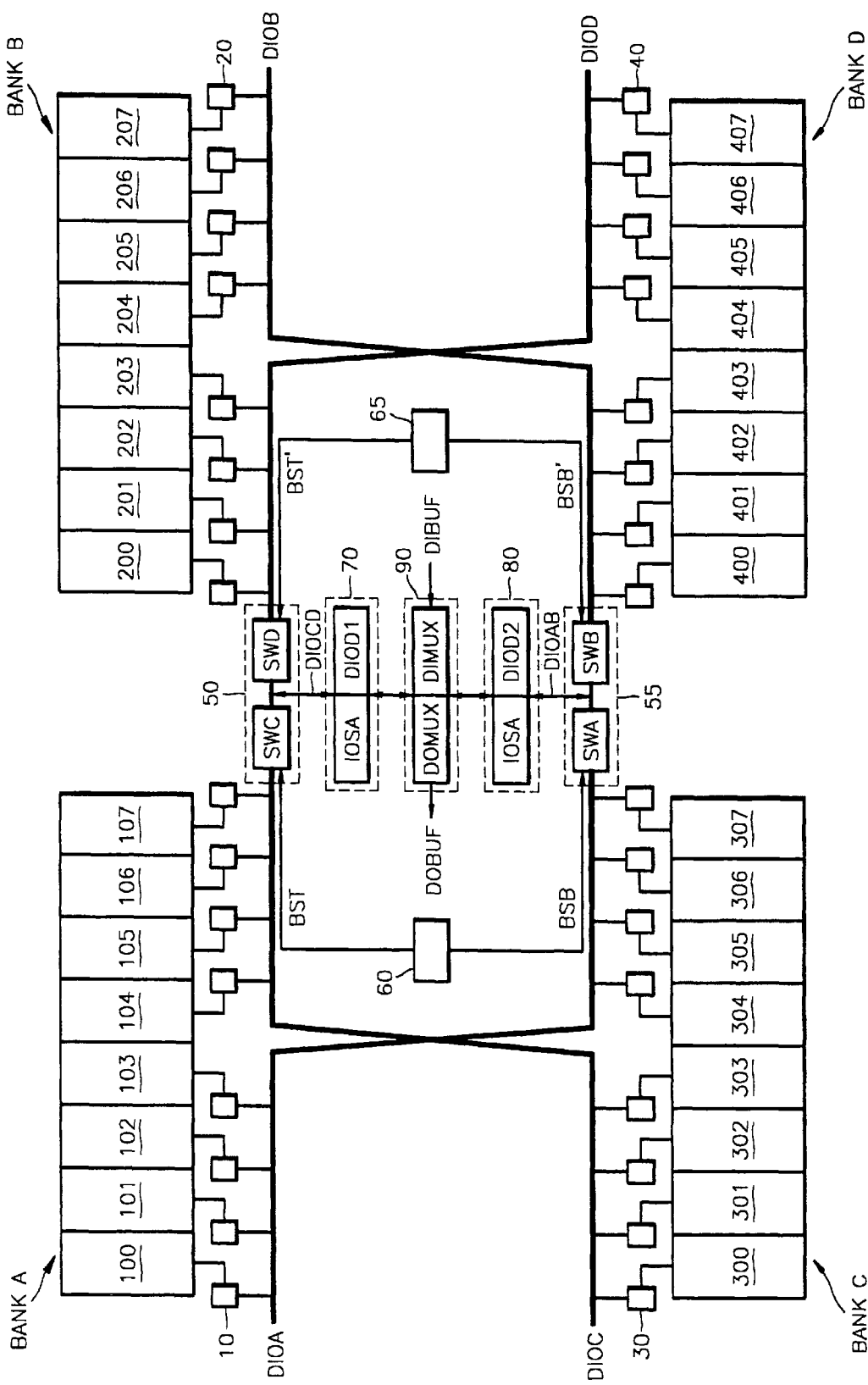
FIG. 1 is a block diagram of an integrated circuit memory device according to a first embodiment of the present invention.
Figure 2:
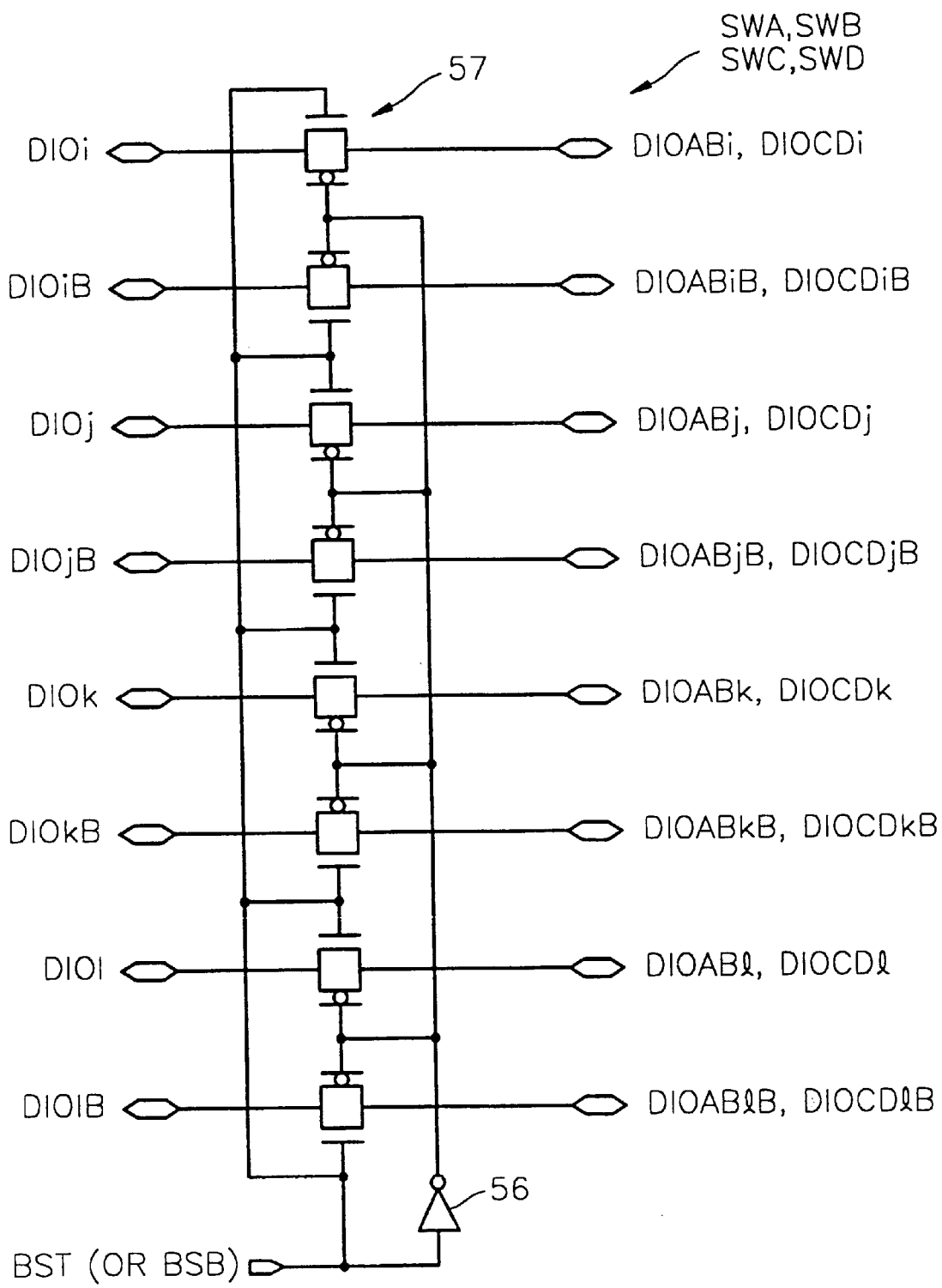
FIG. 2 is an electrical schematic of a preferred bank selection switch, according to the first embodiment of the present invention.

Referring now to FIGS. 1–4, preferred integrated circuit memory devices according to a first embodiment of the present invention will be described. In particular, FIG. 1 is a block diagram of a preferred multi-bank integrated circuit memory device that comprises a plurality of memory banks (BANK A–BANK D). As illustrated, BANK A comprises a first plurality of memory blocks 100–107, BANK B comprises a second plurality of memory blocks 200–207, BANK C comprises a third plurality of memory blocks 300–307 and BANK D comprises a fourth plurality of memory blocks 400–407. As will be understood by those skilled in the art, these memory blocks may comprise separate arrays of memory cells or different portions of a single array within a memory bank. A plurality of data buses DIOA–DIOD are also provided. In particular, the first data bus DIOA may comprise four (4) pairs of differential data lines that are electrically coupled in a preferred manner to a corresponding number of data transmission devices 10 associated with BANK A and a corresponding number of data transmission devices 30 associated with BANK C. These four pairs of differential data lines may be represented as DIOi, DIOiB, DIOj, DIOjB, DIOk, DIOkB and DIOl, DIOlB, as illustrated by FIG. 2. Likewise, the second data bus DIOC may comprise four (4) pairs of differential data lines that are electrically coupled to a corresponding number of data transmission devices 10 associated with BANK A and a corresponding number of data transmission devices 30 associated with BANK C. As will be understood by those skilled in the art, these data transmission devices 10 and 30 may be of conventional design and may perform the functions of transmitting data between the buses and respective memory blocks within each memory bank. These data transmission devices 10 and 30 may also provide respective high impedance states to the data buses when the devices are inactive. Based on the illustrated configuration of BANK A and BANK C, data transmission devices 10 and 30 and the first and second data buses DIOA and DIOC, an operation to read data from BANK A will result in a transfer of read data from memory blocks 100–107 to the illustrated first transmission devices 10. A first half of the read data will then be transferred from the first half of the first transmission devices 10 to the first data bus DIOA and a second half of the read data will be transferred simultaneously from the second half of the first transmission devices 10 to the second data bus DIOC. During the transfer operation, the outputs of the second transmission devices 30 (i.e., ports connected to the first and second data buses DIOA and DIOC) will be disposed in respective high impedance states. Likewise, an operation to read data from BANK C will result in a transfer of read data from memory blocks 300–307 to the illustrated second transmission devices 30. A first half of the read data will then be transferred from the first half of the second transmission devices 30 to the second data bus DIOC and a second half of the read data will be transferred simultaneously from the second half of the second transmission devices 30 to the first data bus DIOA. During the transfer operation, the outputs of the first transmission devices 10 will be disposed in respective high impedance states.

Figure 3:
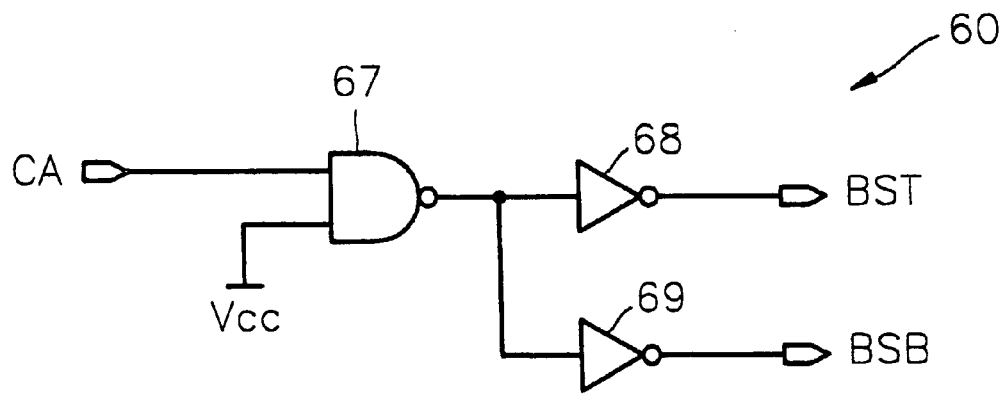
FIG. 3 is an electrical schematic of a preferred first bank selection control circuit, according to the first embodiment of the present invention.

Referring now to FIG. 3, a first bank selection control circuit 60 is illustrated. This first bank selection control circuit 60 comprises a NAND gate 67 and a pair of inverters 68 and 69 connected as illustrated. The first bank selection control circuit 60 is responsive to a column address signal CA (e.g., the most significant bit of a column address) and generates top and bottom bank selection signals BST and BSB at active levels (e.g., logic 1 levels) when the column address signal CA is in a first logic state (e.g., logic 1).

Referring again to FIGS. 1–2, the first bank selection switch SWA (within switching unit 55) comprises a plurality of CMOS transmission gates 57 that are responsive to the bottom bank selection signal BSB and the output of inverter 56. As will be understood by those skilled in the art, the receipt of a logic 1 bottom bank selection signal BSB will electrically connect the pairs of differential data lines within the first data bus DIOA to an internal data bus DIOAB. This internal data bus DIOAB is illustrated as comprising, among other things, four pairs of differential data lines (DIOABi, DIOABiB–DIOABI, DIOABIB). Similarly, the second bank selection switch SWC (within switching unit 50) comprises a plurality of CMOS transmission gates 57 that are responsive to the top bank selection signal BST and the output of inverter 56. As will be understood by those skilled in the art, the receipt of a logic 1 top bank selection signal BST will electrically connect the pairs of differential data lines within the second data bus DIOC to an internal data bus DIOCD. This internal data bus DIOCD is illustrated as comprising, among other things, four pairs of differential data lines (DIOCDi, DIOCDiB–DIOCDI, DIOCDIB).

Referring now to the right side of FIG. 1, the third data bus DIOB may comprise four (4) pairs of differential data lines that are electrically coupled in a preferred manner to a corresponding number of data transmission devices 20 associated with BANK B and a corresponding number of data transmission devices 40 associated with BANK D. The fourth data bus DIOD may also comprise four (4) pairs of differential data lines that are electrically coupled to a corresponding number of data transmission devices 20 associated with BANK B and a corresponding number of data transmission devices 40 associated with BANK D. These data transmission devices 20 and 40 may be of conventional design and may also perform the functions of transmitting data between the buses and respective memory blocks within BANK B and BANK D. These data transmission devices 20 and 40 may also provide respective high impedance states to the data buses when the devices are inactive. Based on the illustrated configuration of BANK B and BANK D, data transmission devices 20 and 40 and the third and fourth data buses DIOB and DIOD, an operation to read data from BANK B will result in a transfer of read data from memory blocks 200–207 to the illustrated third transmission devices 20. A second half of the read data will then be transferred from the second half of the third transmission devices 20 to the third data bus DIOB and a first half of the read data will be transferred simultaneously from the first half of the third transmission devices 20 to the fourth data bus DIOD. During the transfer operation, the outputs of the fourth transmission devices 40 will be disposed in respective high impedance states. Likewise, an operation to read data from BANK D will result in a transfer of read data from memory blocks 400–407 to the illustrated fourth transmission devices 40. A first half of the read data will then be transferred from the first half of the fourth transmission devices 40 to the third data bus DIOD and a second half of the read data will be transferred simultaneously from the second half of the fourth transmission devices 40 to the fourth data bus DIOD. During the transfer operation, the outputs of the third transmission devices 20 will be disposed in respective high impedance states.

Figure 4:
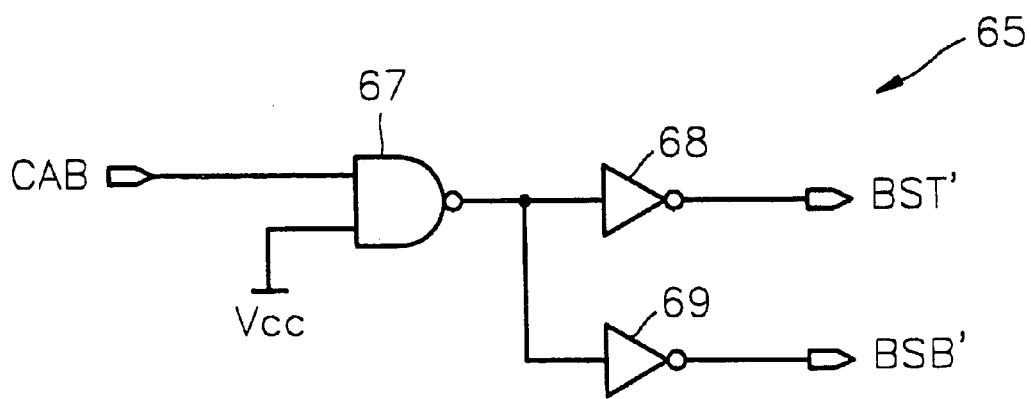
FIG. 4 is an electrical schematic of a preferred second bank selection control circuit, according to the first embodiment of the present invention.

Referring now to FIG. 4, a second bank selection control circuit 65 is illustrated. This second bank selection control circuit 65 comprises a NAND gate 67 and a pair of inverters 68 and 69 connected as illustrated. The second bank selection control circuit 65 is responsive to a complementary column address signal CAB and generates top and bottom bank selection signals BST' and BSB' at active levels (e.g., logic 1 levels) when the complementary column address signal CAB is in a first logic state (e.g., logic 1) and the column address signal CA is in a second logic state (e.g., logic 0). Referring again to FIGS. 1–2, the third bank selection switch SWB (within switching unit 55) comprises a plurality of CMOS transmission gates 57 that are responsive to the bottom bank selection signal BSB' and the output of inverter 56. The receipt of a logic 1 bottom bank selection signal BSB' will electrically connect the pairs of differential data lines within the third data bus DIOB to the internal data bus DIOAB. Similarly, the fourth bank selection switch SWD (within switching unit 50) comprises a plurality of CMOS transmission gates 57 that are responsive to the top bank selection signal BST' and the output of inverter 56. The receipt of a logic 1 top bank selection signal BST' will electrically connect the pairs of differential data lines within the fourth data bus DIOD to an internal data bus DIOCD.

Based on the above description of the data buses DIOA––DIOD and the bank selection switches SWA–SWD, data read from each memory bank is passed as read data on two data buses that are electrically coupled to different bank selection switches (SWA and SWC or SWB and SWD). However, because these different pairs of bank selection switches are enabled simultaneously by the respective bank selection control circuits 60 or 65, the read data supplied to the separate data buses can be passed simultaneously to first and second groups of sense amplifiers IOSA (within data input/output units 70 and 80) and then upon amplification to an output multiplexer DOMUX within a multiplexer circuit 90. The read data may then be transferred from the output multiplexer DOMUX to a output buffer DOBUF (not shown). Accordingly, if the third and fourth data buses DIOB and DIOD are four bits wide, for example, two groups of four sense amplifiers may be used when data is being read from BANK B and these same two groups of sense amplifiers may also be used when data is being read from BANK D. Similarly, if the first and second data buses DIOA and DIOC are four bits wide, for example, the same two groups of four sense amplifiers may be used when data is being read from BANK A and when data is being read from BANK C. Thus, only a reduced number of sense amplifiers (e.g., 8) are required to support reading operations performed on a plurality of memory banks. In addition, a reduced number of input/output units 70 and 80 can be utilized to support a larger number of memory banks. Accordingly, by using bank selection switches SWA–SWD to control access to a reduced number of sense amplifiers and drivers, memory devices according to the present invention can have reduced layout area requirements.

Referring again to FIG. 1, the data input/output units 70 and 80 also include input/output driver devices DIOD1 and DIOD2 that may operate during both reading and writing modes of operation. The multiplexer circuit 90 also preferably includes a data input multiplexer DIMUX that receives input data (e.g., write data) from an input multiplexer DIBUF (not shown). This data is then transferred to the internal data buses DIOAB and DIOCD which in turn transfer the data to the bank selection switches.

Figure 5:
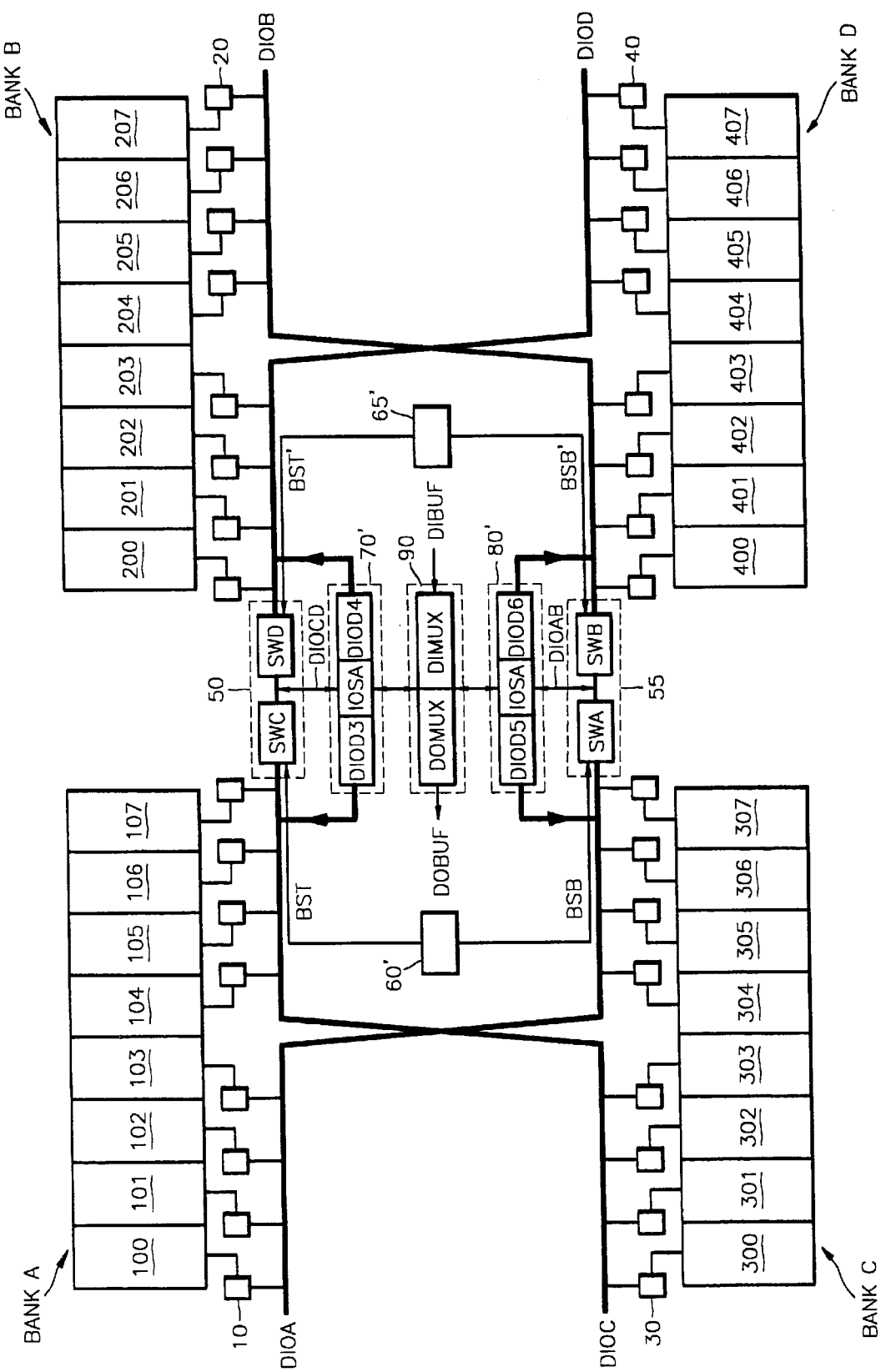
FIG. 5 is a block diagram of an integrated circuit memory device according to a second embodiment of the present invention.
Figure 6:
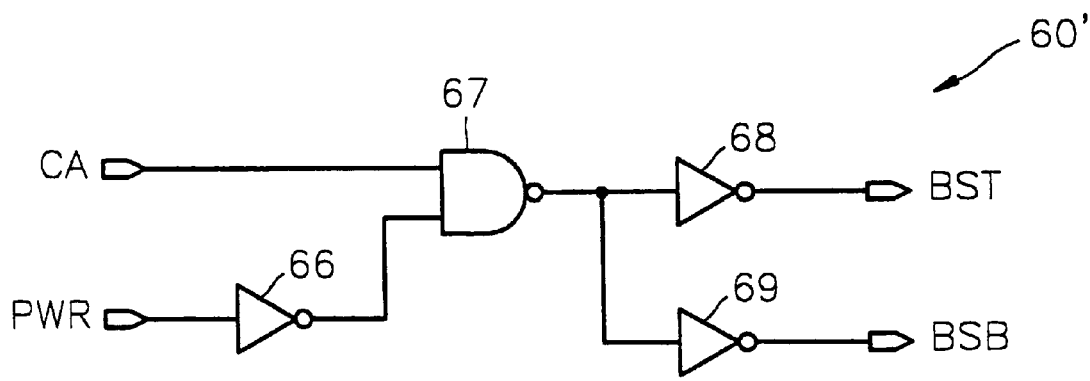
FIG. 6 is an electrical schematic of a preferred first bank selection control circuit, according to the second embodiment of the present invention.
Figure 7:
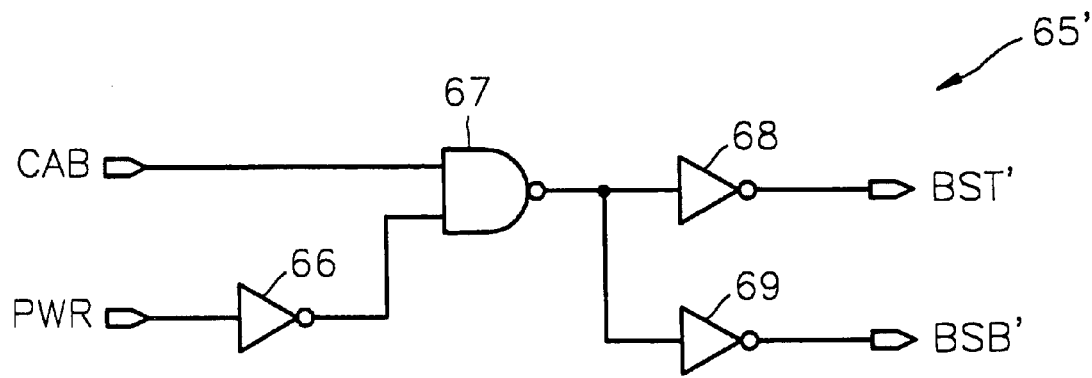
FIG. 7 is an electrical schematic of a preferred second bank selection control circuit, according to the second embodiment of the present invention.

Referring now to FIGS. 5–7, preferred integrated circuit memory devices according to a second embodiment of the present invention will be described. In particular, FIG. 5 illustrates an integrated circuit memory device that is similar to the device of FIG. 1 during reading operations, however, preferred drivers are provided which enable the bank selection switches SWA–SWD to be bypassed during writing operations. These drivers, which are illustrated as DIOD3–DIOD6 within data input/output units 70' and 80', are capable of driving the data buses DIOA–DIOD directly with write data. These drivers may operate at the same time to provide write data to their respective data buses and the data transmission devices may then be selectively enabled to provide the write data to the corresponding memory bank. During write operations, the bank selection switches SWA–SWD are disabled when a master write signal PWR is set to a logic 1 level. This disabling feature is provided by the bank selection control circuits 60' and 65' illustrated by FIGS. 6–7. In particular, FIG. 6 illustrates a first bank selection control circuit 60' that is similar to the bank selection control circuit 60 of FIG. 3, however, an inverter 66 is provided to receives the master write signal PWR. As will be understood by those skilled in the art, a logic 1 master write signal PWR will cause both the top and bottom bank select signals BST and BSB to be held at inactive logic 0 levels irrespective of the value of the column address signal CA. Similarly, with respect to FIG. 7, a logic 1 master write signal PWR will cause both the top and bottom bank select signals BST' and BSB' to be held at inactive logic 0 levels irrespective of the value of the complementary column address signal CAB. Accordingly, both the inputs and outputs of the bank selection switches of FIG. 2 will be held in high impedance states during a write operation. By bypassing the bank selection switches, reductions in write time can be achieved.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. An integrated circuit memory device, comprising:
   first and second memory banks which each have respective pluralities of memory blocks therein;
   first and second data buses; and
   means for providing read data from first and second memory blocks within said first memory bank to said first and second data buses, respectively, during a first read operation and for providing read data from second and first memory blocks within said second memory bank to said first and second data buses, respectively, during a second read operation.

2. The device of claim 1, wherein said first data bus comprises a first plurality of pairs of differential data lines; and wherein said providing means comprises means for electrically coupling the first plurality of pairs of differential data lines to the first memory blocks within said first memory bank during the first read operation and for electrically coupling the first plurality of pairs of differential data lines to the second memory blocks within said second memory bank during the second read operation.

3. The device of claim 2, wherein said second data bus comprises a second plurality of pairs of differential data lines; and wherein said providing means comprises means for electrically coupling the second plurality of pairs of differential data lines to the second memory blocks within said first memory bank during the first read operation and for electrically coupling the second plurality of pairs of differential data lines to the first memory blocks within said second memory bank during the second read operation.

4. The device of claim 3, wherein said first data bus consists of N pairs of differential data lines; and wherein said first memory bank consists of 2N memory blocks.

5. The device of claim 4, wherein said providing means comprises:
   2N first data transmission devices electrically coupled to the first and second memory blocks within the first memory bank; and
   2N second data transmission devices electrically coupled to the first and second memory blocks within the second memory bank.

6. The device of claim 5, wherein said first plurality of pairs of differential data lines are electrically connected to N of said 2N first data transmission devices and are electrically connected to N of said 2N second data transmission devices; and wherein said second plurality of pairs of differential data lines are electrically connected to N of said 2N first data transmission devices and are electrically connected to N of said 2N second data transmission devices.

7. The device of claim 3, further comprising a first bank selection switch electrically coupled to said first data bus; and a second bank selection switch electrically coupled to said second data bus.

8. The device of claim 7, further comprising a first plurality of sense amplifiers electrically coupled to said first bank selection switch; and a second plurality of sense amplifiers electrically coupled to said second bank selection switch.

9. The device of claim 8, wherein said first bank selection switch comprises a first plurality of CMOS transmission gates; and wherein said second bank selection switch comprises a second plurality of CMOS transmission gates.

10. The device of claim 8, wherein said first and second bank selection switches are responsive to first and second bank selection signals, respectively; and wherein said first and second bank selection switches electrically connect said first and second data buses to said first and second pluralities of sense amplifiers, respectively, when the first and second bank selection signals are set to active levels.

11. The device of claim 10, further comprising a bank selection control circuit that is responsive to a column address signal and simultaneously generates the first and second bank selection signals at active levels when the column address signal is in a first logic state.

12. An integrated circuit memory device, comprising:
   first and second memory banks which each have a plurality of memory blocks therein;
   first and second data buses;
   a first plurality of sense amplifiers; and
   means for providing read data from first and second memory blocks within said first memory bank to said first and second data buses, respectively, and to said first plurality of sense amplifiers during a first read operation and for providing read data from second and first memory blocks within said second memory bank to said first and second data buses, respectively, and to said first plurality of sense amplifiers during a second read operation.

13. A method of operating a multi-bank integrated circuit memory device, comprising the steps of:
   transferring first read data from first and second memory blocks within a first memory bank to first and second data buses, respectively;
   transferring the first read data from the first and second data buses to first and second sense amplifiers, respectively;
   transferring second read data from first and second memory blocks within a second memory bank to the first and second data buses, respectively; and
   transferring the second read data from the first and second data buses to the first and second sense amplifiers, respectively.

14. The method of claim 13, wherein said step of transferring the first read data from the first and second data buses to first and second sense amplifiers comprises the steps of simultaneously transferring a first portion of the first read data from the first data bus through a first bank selection switch to the first sense amplifier and a second portion of the first read data from the second data bus through a second bank selection switch to the second sense amplifier.

15. The method of claim 14, further comprising the step of disposing the first bank selection switch in a high impedance state in response to an active master write signal.

16. The method of claim 14, further comprising the steps of:

transferring a first portion of first write data from the first sense amplifier to the first data bus while simultaneously transferring a second portion of the first write data from the second sense amplifier to the second data bus; and transferring the first and second portions of the first write data from the first and second data buses, respectively, to the first memory bank.

17. The method of claim 16, wherein said step of transferring a first portion of first write data from the first sense amplifier to the first data bus is performed simultaneously with the step of disposing the first bank selection switch in a high impedance state in response to an active master write signal.

18. The method of claim 16, wherein said step of transferring a first portion of first write data from the first sense amplifier to the first data bus is performed without transferring the first portion of the first write data through the first or second bank selection switches.

19. The method of claim 18, wherein said step of transferring a first portion of first write data from the first sense amplifier to the first data bus is performed simultaneously with the step of disposing the first bank selection switch in a high impedance state in response to an active master write signal.

* * * * *